United States Patent
Choi

(10) Patent No.: US 6,841,465 B2
(45) Date of Patent: Jan. 11, 2005

(54) METHOD OF FORMING DUAL DAMASCENE PATTERN IN SEMICONDUCTOR DEVICE

(75) Inventor: Jae Sung Choi, Cheongjoo-shi (KR)

(73) Assignee: Hynix Semiconductor Inc., Ichon (KR)

( * ) Notice: Subject to any disclaimer, the term of this patent is extended or adjusted under 35 U.S.C. 154(b) by 17 days.

(21) Appl. No.: 10/614,512

(22) Filed: Jul. 8, 2003

(65) Prior Publication Data

US 2004/0121588 A1 Jun. 24, 2004

(30) Foreign Application Priority Data

Dec. 23, 2002 (KR) .................................. 10-2002-0082661

(51) Int. Cl.$^7$ .......................................... H01L 21/4763
(52) U.S. Cl. ..................... 438/622; 438/637; 438/638; 438/700; 438/702; 438/703; 438/736; 438/948; 438/949; 438/950; 438/952
(58) Field of Search ..................... 438/622, 637–638, 438/700, 702–703, 736, 948–950, 952

(56) References Cited

U.S. PATENT DOCUMENTS

| | | | |
|---|---|---|---|
| 5,403,435 A | * | 4/1995 | Cathey et al. .............. 438/669 |
| 6,020,255 A | | 2/2000 | Tsai et al. |
| 6,521,542 B1 | | 2/2003 | Armacost et al. |
| 6,602,794 B1 | * | 8/2003 | Kye ........................... 438/725 |
| 6,720,256 B1 | * | 4/2004 | Wu et al. ................... 438/638 |
| 2002/0084257 A1 | * | 7/2002 | Bjorkman et al. .......... 438/689 |

* cited by examiner

*Primary Examiner*—Lynne A. Gurley
(74) *Attorney, Agent, or Firm*—Jacobson Holman PLLC

(57) ABSTRACT

Disclosed is a method of forming the dual damascene pattern in the semiconductor device. After forming the trench, a photoresist pattern in which a via hole region is defined is formed by exposure and development processes in a state that a photoresist is thinly coated, in a dual damascene process for first forming the trench than a via hole. Therefore, the present invention can prevent degradation of resolution due to a thickness of a photoresist pattern in a trench region and improve reliability of the entire process by simultaneously smoothly performing an etching process even with a thin photoresist pattern due to a good etching tolerance property.

7 Claims, 3 Drawing Sheets

METHOD OF FORMING DUAL DAMASCENE PATTERN IN SEMICONDUCTOR DEVICE

BACKGROUND OF THE INVENTION

1. Field of the Invention

The present invention relates to a method of forming a dual damascene pattern in a semiconductor device, and more particularly, to a method of forming a dual damascene pattern in a semiconductor device capable of improving resolution of an exposure and development process for forming a photoresist pattern.

2. Background of the Related Art

Recently, as the semiconductor device is higher integrated while the design rule is thus reduced since the process technology is continuously advanced, parasitic capacitance between the wire resistors or the wires serves as a decisive factor in deciding the operation speed of the device. These days, a process of forming the metal wire using Cu in lieu of Al has been highlighted as a wiring process of a next generation device.

However, there is a difficulty in forming the wires using Cu since the etching characteristic of Cu is very poor. In order to solve this problem, the metal wire is formed using a metal material having a poor etching characteristic as well as Cu by means of a dual damascene process and an electroplating method. This dual damascene process will be now described in more detail.

FIG. 1(a)~FIG. 1(d) are cross-sectional views of semiconductor devices for explaining a conventional method of forming a dual damascene pattern in the device.

Referring to FIG. 1(a), in order to form a semiconductor device, an interlayer insulating film 102 is formed on a semiconductor substrate 101 in which various components (not shown) such as a transistor or a flash memory cell are formed. A resist is then coated on the interlayer insulating film 102. Next, a first photoresist pattern 103 in which a trench region is defined is formed through exposure and development processes.

By reference to FIG. 1(b), the interlayer insulating film 102 in a region exposed through a first photoresist pattern (103 in FIG. 1(a)) is etched by a given depth, thereby forming a trench 104. The first photoresist pattern is then removed.

With reference to FIG. 1(c), a resist is coated on the interlayer insulating film 102. A second photoresist pattern 105 in which a via hole region is defined is formed through the exposure and development processes.

Turning to FIG. 1(d), the interlayer insulating film 102 in the region exposed through the second photoresist pattern (105 in FIG. 1(c)) is etched to form a via hole 106 through which the junction (not shown) at the bottom is exposed. Thereafter, the second photoresist pattern is removed. Thereby, a dual damascene pattern 107 consisting of the trench 104 and the via hole 106 is completed.

Hereinafter, although not shown in the drawings, in order to prevent metal component of the metal wire to be formed in a subsequent process from infiltrating into the interlayer insulating film, a barrier metal layer is formed on the interlayer insulating film, a metal seed layer is formed only within the via and trench, and the via and the trench are then buried with the metal material by an electroplating method, thus forming the metal wire. After the metal wire is formed, additional chemical mechanical polishing process is implemented to remove a thin metal film formed on the interlayer insulating film other than the via and trench.

As in the above, the dual damascene process for first forming the trench is simple and has a less problem in the etching process than the dual damascene process. Accordingly, this process has been recognized one of the methods having a high reproducibility. However, from the viewpoint of the lithography, the dual damascene process that first forms the trench then the via hole must form a second photoresist pattern for defining the via hole region with the step generated by the trench. For this reason, there is a problem that resolution is fatally influenced since the photoresist pattern is thickly formed in the trench region, as in FIG. 1(c). Accordingly, it is recently recognized that this process is rarely used since it is difficult to overcome the above problem.

SUMMARY OF THE INVENTION

Accordingly, the present invention is contrived to substantially obviate one or more problems due to limitations and disadvantages of the related art.

An object of the present invention is to provide a method of forming a dual damascene pattern in a semiconductor device capable of preventing degradation of resolution due to a thickness of a photoresist pattern in a trench region and simultaneously improving reliability of the entire process by smoothly performing an etching process even with a thin photoresist pattern due to a good etching tolerance property, in such a manner that after forming the trench, a photoresist pattern in which a via hole region is defined is formed by exposure and development processes in a state that a photoresist is thinly coated, in a dual damascene process for first forming the trench than a via hole.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of forming a dual damascene pattern in a semiconductor device according to the present invention is characterized in that it comprises the steps of providing a semiconductor substrate in which an interlayer insulating film is formed and a trench of a given pattern is formed in the interlayer insulating film, forming a photoresist pattern in which a via hole region is defined, in the trench, forming a high polymer solution coating film containing a crosslinkable agent or a radical generator, on the entire structure, reacting to the crosslinkable agent or the radical generator with polymer of the photoresist pattern by means of a baking process so that an etching tolerance property is increased, thereby forming a hardened photoresist pattern, removing the high polymer solution coating film, and forming a via hole in the interlayer insulating film by means of an etching process, wherein the photoresist pattern is thinly formed relatively as much as the etching tolerance property is increased by the hardened photoresist pattern.

In the above, a resist containing the crosslinkable agent or a resist containing an exposure active radical agent is coated in order to prevent mixing with a high polymer compound.

At this time, the crosslinkable agent may be multi-functional ether or multi-functional alkyl halo compound and the multi-functional ether may be methyl ether or ethyl ether. Furthermore, the radical generator is a thermal radical generator or its inducer.

Meanwhile, the high polymer solution coating film is formed using aqueous high polymer solution and may use de-ionized water as a solvent.

The baking process is implemented in an oven or hot plate heating mode and may be performed at a temperature of 50~250° C.

In another aspect of the present invention, it is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Figure 1A:
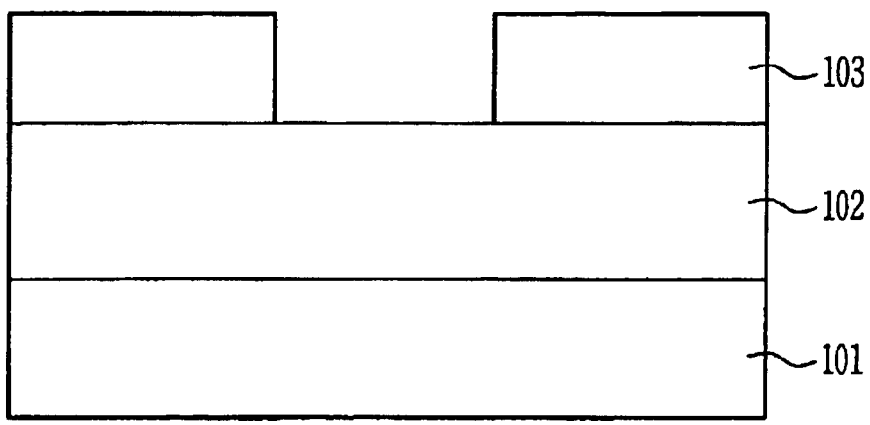
FIG. 1(a)~FIG. 1(d) are cross-sectional views of semiconductor devices for explaining a conventional method of forming a dual damascene pattern in the device.
Figure 1B:
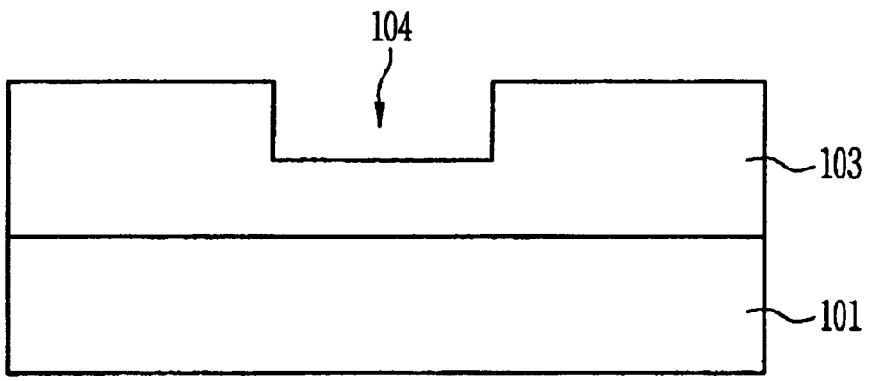
Figure 1C:
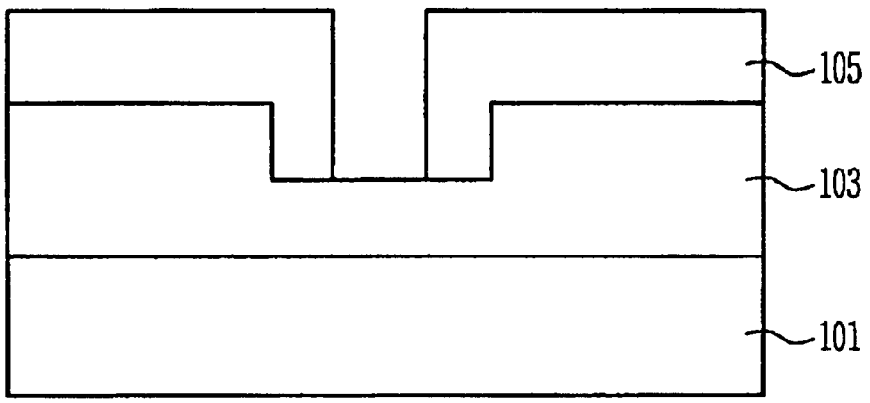
Figure 1D:
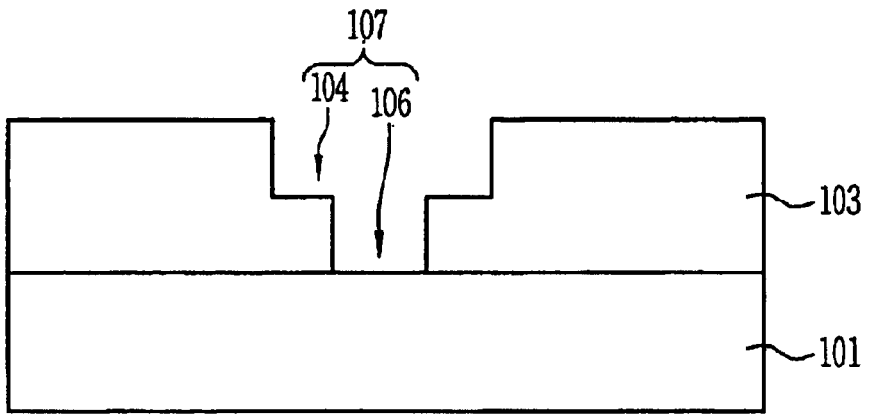

Reference will now be made in detail to the preferred embodiments of the present invention, examples of which are illustrated in the accompanying drawings, in which like reference numerals are used to identify the same or similar parts.

FIG. 2a~FIG. 2f are cross-sectional views of semiconductor devices for explaining a method of forming a dual damascene pattern in the device according to a preferred embodiment of the present invention.

Figure 2A:
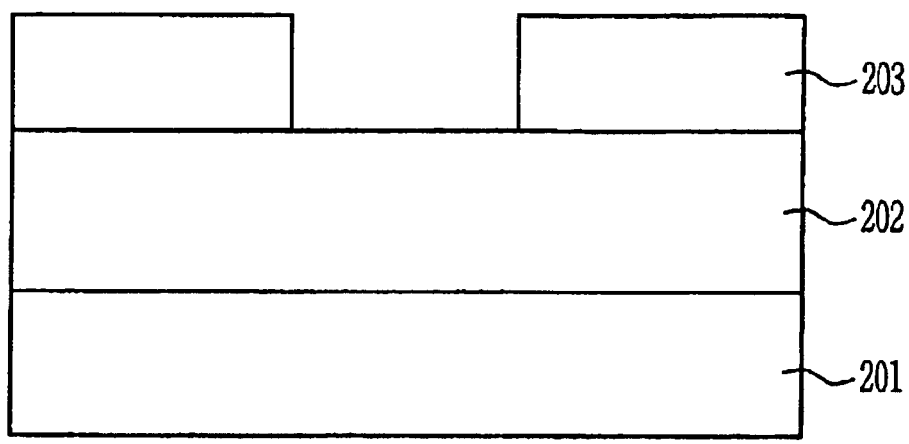
FIG. 2a~FIG. 2f are cross-sectional views of semiconductor devices for explaining a method of forming a dual damascene pattern in the device according to a preferred embodiment of the present invention.

Referring to FIG. 2a, in order to form a semiconductor device, an interlayer insulating film 202 is formed on a semiconductor substrate 201 in which various components (not shown) such as a transistor or a flash memory cell are formed. A resist is then coated on the interlayer insulating film 202. Next, a first photoresist pattern 203 in which a trench region is defined is formed through exposure and development processes.

Figure 2B:
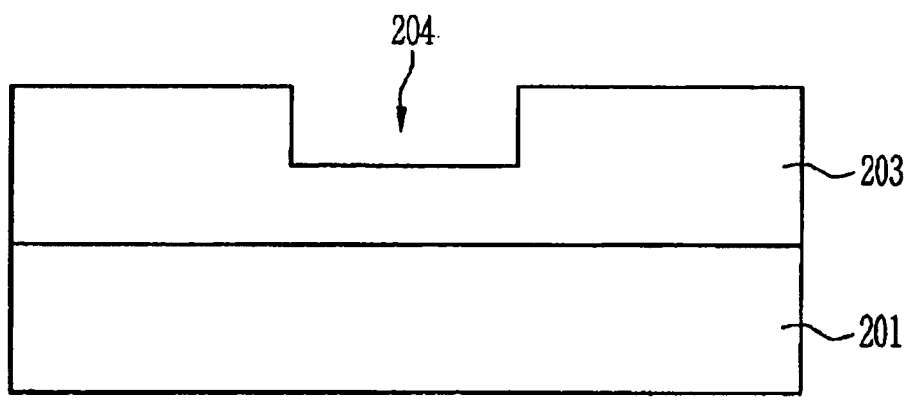

By reference to FIG. 2b, the interlayer insulating film 202 in a region exposed through a first photoresist pattern (203 in FIG. 2a) is etched by a given depth, thereby forming a trench 204. The first photoresist pattern is then removed.

Figure 2C:
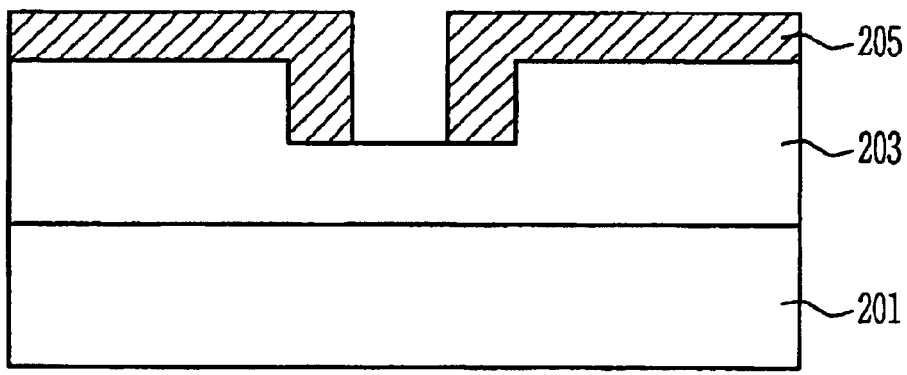

With reference to FIG. 2c, a resist is coated on the interlayer insulating film 202. A second photoresist pattern 205 in which a via hole region is defined is formed through the exposure and development processes. At this time, if the second photoresist pattern 205 is thickly formed in the region where the trench is formed, resolution may be degraded in the exposure and development process. In order to prevent this, it is required that the second photoresist pattern 205 be formed widely. Meanwhile, if the second photoresist pattern 205 is too thinly formed, the surface of the semiconductor substrate 201 may be damaged by an etch as the second photoresist pattern formed on the semiconductor substrate 201 is removed, in a subsequent etching process for forming the via hole. Accordingly, the thickness of the second photoresist pattern 205 is decided considering an etching tolerance property of a hardened stat in a subsequent process.

Figure 2D:
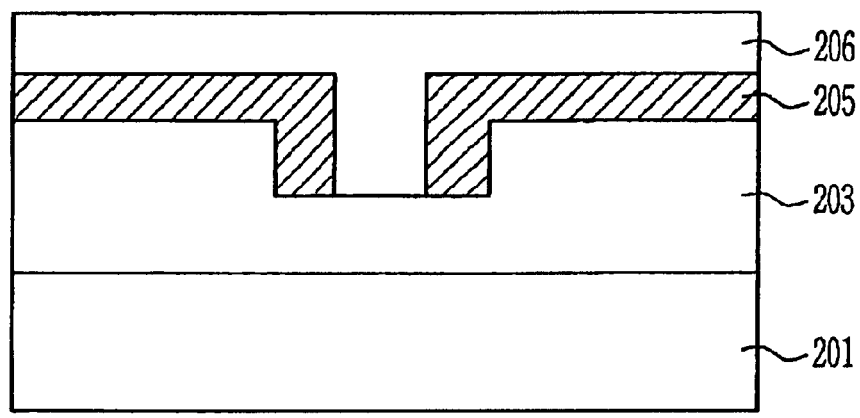

Turning to FIG. 2d, a high polymer solution is coated on the entire structure by means of a spin coating method in order to harden the second photoresist pattern 205, thereby forming a high polymer solution coating film 206. At this time, the high polymer solution employs a high polymer solution containing a crosslinkable agent or a radical generator. In this case, the high polymer solution used employs an aqueous high polymer solution so that it is similar to a top anti-reflective coating film (not shown) that is usually used in the lithography process. The high polymer solution uses DI water as a solvent. In case of the aqueous high polymer solution using water as the solvent, it could be coated while preventing mixing with the second photoresist pattern 205 such as the existing top anti-reflective coating film in case of a double coating.

In the above, the multi-functional ether or the multi-functional alkyl halo compound could be used as the crosslinkable agent. At this time, the multi-functional ether may be methyl ether or ethyl ether. The multi-functional alkyl halo compound may be alkyl chloro compound, alkyl bromo compound and alkyl iodo compound.

Figure 2E:
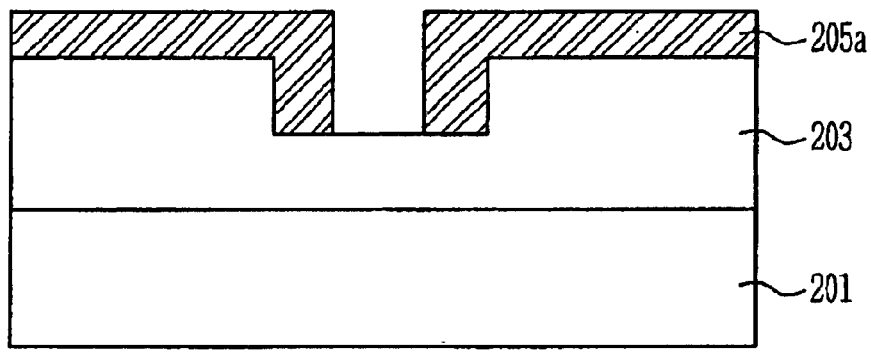

Meanwhile, the radical generator may use a thermal radical generator such as AIBN or its inducer Referring to FIG. 2e, in order to increase the etching tolerance property, the second photoresist pattern (205 in FIG. 2d) is hardened through annealing using a baking process, thus forming a hardened second photoresist pattern 205a. At this time, it is preferred that annealing is implemented in an oven or hot plate heating mode and is performed at a temperature of 50~250° C. Thereafter, a cleaning process using de-ionized water is implemented to remove the high polymer coating film (206 in FIG. 2d) that does not react and remains on the substrate 201. The principle that the hardened second photoresist pattern 205a is formed by annealing will be described as follows.

In case where the aqueous high polymer solution coating film (206 in FIG. 2d) containing the crosslinkable agent was formed in FIG. 2d, the crosslinkable agent is diffused from the high polymer solution coating film (206 in FIG. 2d) to the second photoresist pattern (205 in FIG. 2d) due to annealing. The crosslinkable agent diffused into the second photoresist pattern (205 in FIG. 2d) is radically crosslinked with polymer of the second photoresist pattern (205 in FIG. 2d) to form an O-crosslinkable agent-O structure. Through this crosslink, the second photoresist pattern is hardened to be the hardened second photoresist pattern 205a, so that the etching tolerance property is rapidly increased.

Meanwhile, in case where the aqueous high polymer solution coating film (206 in FIG. 2d) containing the radical generator was formed in FIG. 2d, a radical is generated in the radical generator and the radical is diffused from the aqueous high polymer solution to the photoresist pattern (205 in FIG. 2d) by annealing. The radical is generated and diffusion during the annealing and the radical diffused into the second photoresist pattern (205 in FIG. 2d) is radically crosslinked with polymer of the second photoresist pattern (205 in FIG. 2d) to form a C—C bonding. Through this crosslink, the second photoresist pattern is hardened to be the hardened second photoresist pattern 205a, so that the etching tolerance property is rapidly increased.

Figure 2F:
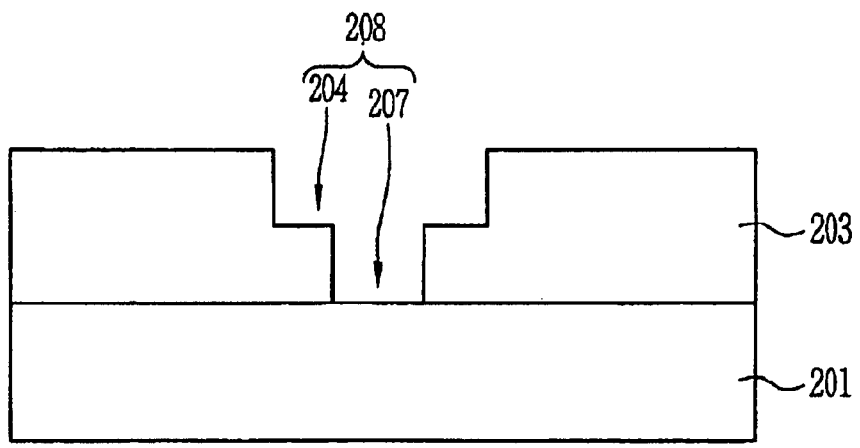

By reference to FIG. 2f, the interlayer insulating film 202 in the region exposed through the hardened second photoresist pattern (205a in FIG. 2e) is etched to form a via hole 207 through which a junction (not shown) at the bottom is exposed. Next, the second photoresist pattern is removed. Thereby, a dual damascene pattern 208 consisting of the trench 204 and the via hole 207 is completed.

Hereinafter, although not shown in the drawings, in order to prevent metal component of the metal wire to be formed in a subsequent process from infiltrating into the interlayer insulating film, a barrier metal layer is formed on the interlayer insulating film, a metal seed layer is formed only within the via and trench, and the via and the trench are then buried with the metal material by an electroplating method, thus forming the metal wire. After the metal wire is formed, additional chemical mechanical polishing process is implemented to remove a thin metal film formed on the interlayer insulating film other than the via and trench.

As described above, according to the present invention, in the dual damascene process for first forming the trench than the via hole, after the trench is formed, the photoresist pattern for defining the via hole region is formed using a photoresist having a good etching tolerance property. Therefore, the present invention has new effects that it can prevent degradation of resolution due to a thickness of the photoresist pattern even in the trench region and thus improve reliability of the process.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed are:

1. A method of forming a dual damascene pattern in a semiconductor device, comprising the steps of:

providing a semiconductor substrate in which an interlayer insulating film is formed and a trench of a given pattern is formed in the interlayer insulating film;

forming a photoresist pattern in which a via hole region is defined, in the trench;

forming a high polymer solution coating film containing a crosslinkable agent or a radical generator, on the entire structure;

reacting to the crosslinkable agent or the radical generator with polymer of the photoresist pattern by means of a baking process so that an etching tolerance property is increased, thereby forming a hardened photoresist pattern;

removing the high polymer solution coating film; and forming a via hole in the interlayer insulating film by an etching process, wherein the photoresist pattern is thinly formed relatively as much as the etching tolerance property is increased by the hardened photoresist pattern to form said dual damascene pattern.

2. The method as claimed in claim 1, wherein the crosslinkable agent is multi-functional ether or multi-functional alkyl halo compound.

3. The method as claimed in claim 2, wherein the multi-functional ether is methyl ether or ethyl ether.

4. The method as claimed in claim 2, wherein the multi-functional alkyl halo compound is alkyl chloro compound, alkyl bromo compound or alkyl iodo compound.

5. The method as claimed in claim 1, wherein the radical generator is a thermal radical generator or its inducer.

6. The method as claimed in claim 1, wherein the high polymer solution coating film is formed using aqueous high polymer solution and uses de-ionized water as a solvent.

7. The method as claimed in claim 1, wherein the baking process is implemented in an oven or hot plate heating mode and is performed at a temperature of 50~250° C.

* * * * *